United States Patent [19]

Brody

[11] Patent Number: 4,524,294
[45] Date of Patent: Jun. 18, 1985

[54] FERROELECTRIC PHOTOMECHANICAL ACTUATORS

[75] Inventor: Philip S. Brody, Bethesda, Md.

[73] Assignee: The United States of America as represented by the Secretary of the Army, Washington, D.C.

[21] Appl. No.: 607,557

[22] Filed: May 7, 1984

[51] Int. Cl.$^3$ ............................................. H01L 41/08
[52] U.S. Cl. .................................... 310/311; 310/330; 310/332; 310/358; 310/366; 310/328
[58] Field of Search ............... 310/311, 328, 332, 331, 310/357, 358, 366; 29/25.35; 252/62.9

[56] References Cited

U.S. PATENT DOCUMENTS

| 3,585,416 | 6/1971 | Mellen | 310/311 |
| 4,252,440 | 2/1981 | Frosch et al. | 356/216 |

FOREIGN PATENT DOCUMENTS

| 44-4018 | 2/1969 | Japan | 310/311 |
| 1095042 | 12/1967 | United Kingdom | 310/311 |

OTHER PUBLICATIONS

Ferroelectric–Photoconductor Device, by A. F. Mayadas, IBM Technical Disclosure Bulletin, vol. 13, No. 10, Mar. 1971.

Photomechanical Effect in Noncentrosymmetric Semiconductors–CdS, by Lagowski et al., *Applied Physics Letters*, vol. 20, No. 1, Jan. 1, 1972.

Optomechanical Bimorph Actuator, by Brody, Ferroelectrics 1983, vol. 50, pp. 27–32.

Optical Harmonic Generation in Two Ferroelectric Crystals, by Smith, Applied Optics, vol. 3, No. 1, Jan. 1964.

*Primary Examiner*—Mark O. Budd
*Attorney, Agent, or Firm*—Anthony T. Lane; Robert P. Gibson; Saul Elbaum

[57] ABSTRACT

A method for deforming materials which are ferroelectric, have remanent polarization, and which exhibit a length-dependent photoelectric effect. One type of material is photovoltaic, piezoelectric, ferroelectric ceramics. Illuminating such materials causes them to deform, either in length or in thickness, depending on the direction of the remanent polarization. A single plate of such material may be used, or a pair of plates bonded together may be used.

20 Claims, 15 Drawing Figures

FERROELECTRIC PHOTOMECHANICAL ACTUATORS

RIGHTS OF THE GOVERNMENT

The invention described herein may be manufactured and used by or for the United States Government for Government purposes without the payment to me of any royalty thereon.

BACKGROUND OF THE INVENTION

1. Field of the invention

These devices are piezoelectric actuators which are driven by the cross coupling of optically produced voltages (photovoltages) and piezoelectric constriction (inverse piezoelectric effect). This cross coupling is useful only if a strong piezoelectric and photovoltaic response is available in the same material. One type of material which has both of these properties are photovoltaic ferroelectric ceramics. Because of the anomalous photovoltaic properties these materials, a high length dependent voltage appears across an illuminated element of this material. This voltage then produces a strain in the material (or stress if the element is mechanically clamped). The strain is the result of the inverse piezoelectric effect: a voltage applied to a piezoelectric material induces a strain in the material. Photovoltaic ferroelectric ceramics, in addition to anomalous high photovoltages, are characterized by strong piezoelectric coupling and exhibit a strong inverse piezoelectric effect.

2. Description of the prior art

Thin cadmium sulfide wafers, having an orientation perpendicular to the crystallographic axis (001), when fastened at one end and exposed to illumination in the visible spectrum, exhibit pronounced bending. The reason given for this is that the light modulates the electric field at the surface (surface barrier) and causes an elastic strain due to the converse piezoelectric effect. See Lagowski et al, "Photomechanical Effect in Noncentrosymmetric Semiconductors-CdS," *Applied Physics Letters*, Volume 20, Number 1, Jan. 1, 1972.

In U.S. Pat. No. 4,252,440 issued Feb. 24, 1981 to Fedors et al, entitled "Photomechanical Transducer," light absorbing ultra-thin films mounted under a fixed strain exhibit the behavior of an optomechanical or photomechanical transducer. The transducer responds to light in a quick and reversible manner converting a time-variable light source into a time-variable mechanical stress.

SUMMARY OF THE INVENTION

A method is provided for deforming materials which are ferroelectric, have remanent polarization, and which exhibit a length-dependent photoelectric effect. This method comprises the step of illuminating a plate of this type of material to cause the deformation of the plate. The plate has an axis and first and second opposite planar faces extending between opposite top and bottom tips to form a rectangular polyhedron.

If the direction of the remanent polarization of the plate is normal to the axis, then the plate will expand normal to the axis, and the length will contract. The wavelength of the illumination may be such that it will be transmitted through the thickness of the plate. If the direction of the remanent polarization is parallel to the axis of the plate, then the plate will expand along its axis. Bending will also occur if the illumination is strongly absorbed within the thickness of the plate as the result of the constraint of the nonilluminated portion of the thickness on the expanding or contracting illuminated portions. In the first case, the plate bends toward the illumination in the second away from the illumination.

The present invention also provides a second method for deforming materials which are ferroelectric, have remanent polarization, and which exhibit a length-dependent photoelectric effect. In this method, a first plate of the material is bonded to a second plate of the material, and at least one of the plates is illuminated to cause the deformation of both of the plates. Each of the plates have an axis and first and second opposite planar faces extending between opposite top and bottom tips to form a rectangular polyhedron.

If the direction of the remanent polarization of the first plate is from its bottom tip to its top tip, and the direction of the remanent polarization of the second plate is from its top tip to its bottom tip, then upon illumination, the illuminated plate will expand along the axis, the other plate will decrease in length along the axis, and the tips will bend away from the source of the illumination. To increase the efficiency of the device, a first electrode is attached to the top tips of the plates, and a second electrode is attached to the bottom tips of the plates.

If the direction of the remanent polarization of the plates is the same and normal to the axis of each plate, then the plates can be caused to expand and contract along the axis with the tips bending toward the source of the illumination. This is accomplished by attaching a transparent electrode to one face of the pair of bonded plates. A second electrode is attached to the other face of the pair of bonded plates, and this electrode is electrically connected to the transparent electrode. A third electrode is attached to the bottom tips of the plates to electrically connect the bottom tips to each other. The third electrode is conncted to the other two electrodes by wires. When the transparent electrode is illuminated, the illuminated plate decreases in length along the axis, the other plate expands in length along the axis and the tips bend toward the source of the light.

The present invention also presents a third method. A plurality of parallel strip electrodes is attached to the first planar face of a plate of ferroelectric material which exhibits a length-dependent photoelectric effect. A plurality of parallel strip electrodes is attached to the second planar face of the plate, the first face being parallel to the second face. The plate has opposite top and bottom tips which define an axis having a specified length and between which extend the first and second planar faces to form a rectangular polyhedron. The electrodes are normal to the axis, extend across the width of the plate, and are evenly separated from each other along the length of the plate.

A positive tangential poling field is applied to the electrodes of the first face of the plate such that the poling field penetrates approximately one half the thickness of the plate. This creates a remanent polarization in the first face that extends along the plate's axis from its bottom tip to its top tip. A negative tangential poling field is applied to the electrodes of the second face of the plate such that the poling field penetrates approximately one half the thickness of the plate. This creates a remanent polarization in the second face that extends along the plate's axis from its top tip to its bottom tip.

Both fields are removed, and the plate is illuminated causing it to expand along its axis and the tips bend away from the source of the light.

This method may further comprise the step of removing the strip electrodes from each face of the plate and attaching a first electrode to the top tip and a second electrode to the bottom tip. Also, the wavelength of the illumination should be such that it will not be transmitted through more than approximately one half of the thickness of the plate.

In each of the above methods the ferroelectric materials can comprise photovoltaic, piezoelectric ceramics. One such ceramic is a solid solution of lead titanate and lead zirconte having the compositional formula $Pb(Zr_{0.53}Ti_{0.47})O_3$ to which is added 1% by weight of niobium oxide. Another such ceramic is a solid solution of lead titanate with 5% by weight of magnesium oxide and 5% by weight of tungsten oxide having the compositional formula $0.9PbTiO_3-0.1Pb(Mg_{\frac{1}{2}}W_{\frac{1}{2}})TiO_3$.

The devices disclosed herein maybe used as optical to fluidic control elements as optical to optical transducers, or in an optically driven switch or valve.

OBJECTS OF THE INVENTION

It is an object of this invention to present materials which are photomechanical actuators.

It is another object of this invention to present materials which expand along their axis and whose tips bend either toward the source of illumination or away from the source of illumination.

It is still another object of this invention to present materials which when exposed to illumination expand normal to their axis.

Another object of this invention to present a pair of plates cemented together of the above described materials which bend either toward or away from the source of illumination.

DESCRIPTION OF THE PREFERRED EMBODIMENTS

Figure 1:
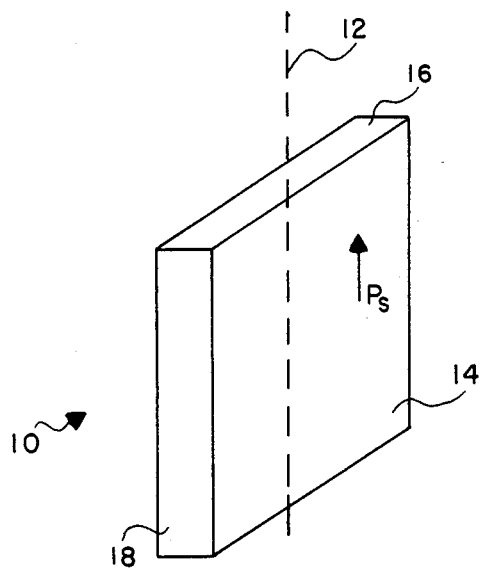
FIG. 1 shows a plate of material which is ferroelectric, has remanent polarization, and which exhibits a length-dependent photoelectric effect.

FIG. 1 shows a plate 10 of material which is ferroelectric, has remanent polarization, and which exhibits a length-dependent photoelectric effect. Plate 10 has an axis 12, a first planar face 14, and a second planar face (not shown) opposite the first planar face. The first and second opposite planar faces extend between top tip 16 and an opposite bottom tip (not shown). Plate 10 has an edge 18 and defines a rectangular polyhedron. The direction of the remanent polarization is from the bottom tip to the top tip and is indicated by arrow $P_s$ in the drawing.

Figure 2:
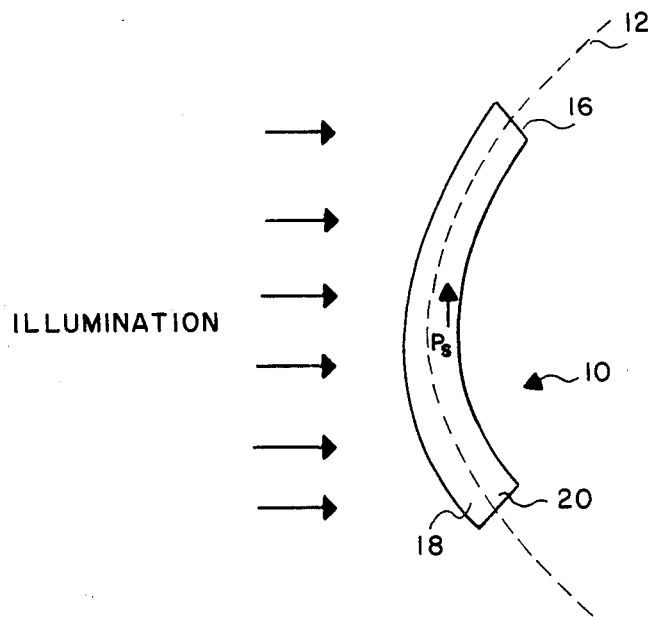
FIG. 2 shows one edge of the plate of FIG. 1 and shows the deformation caused by illuminating the plate. Elements of FIG. 2 which correspond to those of FIG. 1 are correspondingly numbered.

FIG. 2 shows the deformation which occurs when a face of plate 10 is illuminated and the light is absorbed near the illuminated surface. Tips 16 and 20 bend away from the source of illumination. This results from the increase of the length in the surface region of plate 10 while at the same time the rear unilluminated region does not increase in length.

Figure 3:
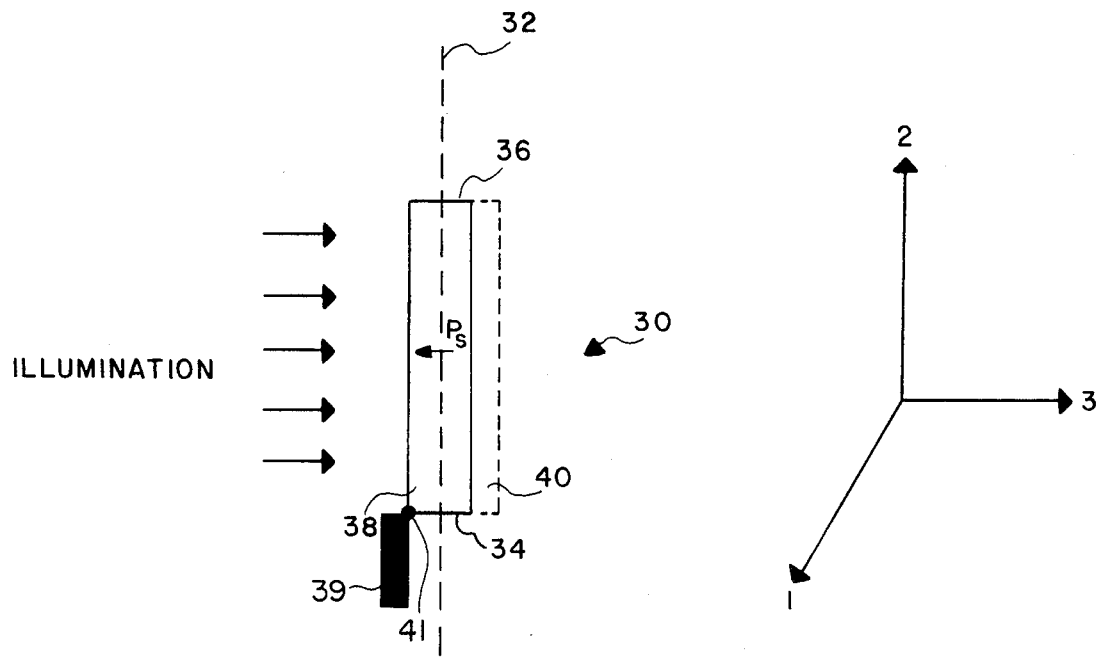
FIG. 3 is an edge view of a plate of material which is ferroelectric, has remanent polarization and which exhibits a length-dependent photoelectric effect.

FIG. 3 shows a plate 30 of material which is ferroelectric, has remanent polarization, and which exhibits a length-dependent photoelectric effect. Plate 30 has an axis 32, an edge 38, and top tip 36 and bottom tip 34. Plate 30 also has first and second opposite planar faces (not shown) extending between opposite top tip 36 and bottom tip 34. Plate 30 has the shape of a rectangular polyhedron. The direction of the remanent polarization is normal to axis 32 and is indicated by arrow $P_s$. The illuminated face of plate 30 is attached to a fixed object 39 at point 41. Upon illumination, the thickness of plate 30 increases, as shown by 40 in the drawing. As the thickness of plate 30 increases, its length decreases. The direction of the increase in thickness is away from the fixed point. If the fixed point is placed on the other side of the plate, the direction of the increase in thickness will be toward the light.

The plate of FIG. 3 may also be transparent to certain wavelengths of light. PLZT ceramic [Pb(Zr$_{0.65}$Ti$_{0.3}$-

5)O$_3$ with a percentage of the lead substituted by lanthanum] is transparent to light in the green and longer wavelengths. The wavelength of the light may be such that it is transmitted through the thickness of the plate. Because of this the initial thickness can be chosen so that the increase in thickness can be specified, for example, to be equal to ¼ of wave length, λ, of the illumination. This can be shown as follows. When the plate is illuminated, the plate will develop a surface charge density $q_o = \epsilon\epsilon_o V_o$ (1). In equation (1), $\epsilon_o$=permittivity of free space, $\epsilon$=dielectric constant, and $V_o$=the saturation photovoltage across the plate. The photovoltaic field $E_3$ is equal to $V_o/d$, where d=plate thickness.

The equation relating strain and the electric field is $$S_3 = S_{33}T_3 + d_{33}E_3, \quad (2)$$

where
T$_3$ is the stress,
S$_{33}$ is an elastic constant,
d$_{33}$ is a piezoelectric constant, and
E$_3$ is the electric field.
For no applied stress and zero clamping, $$S_3 = d_{33}E_3 \quad (3)$$

the change in thickness, $$\delta_d = S_3 d = d_{33}E_3 d, \quad (4)$$

for a given change of thickness, $\delta_d$, $$d = \frac{\delta_d}{d_{33} E_3} \quad (5)$$

Choosing λ=632 nm, δ=¼λ=158 nm, and with $d_{33}=374\times10^{-12}$ C/M, $E_3=10^5$ V/M, d=5.1 mm. That is a 4.2 mm thick plate of PLZT illuminated with 632 nm illumination will increase its thickness by 194 nm, a change in thickness equal to ¼ the illuminating wavelength.

Figure 4:
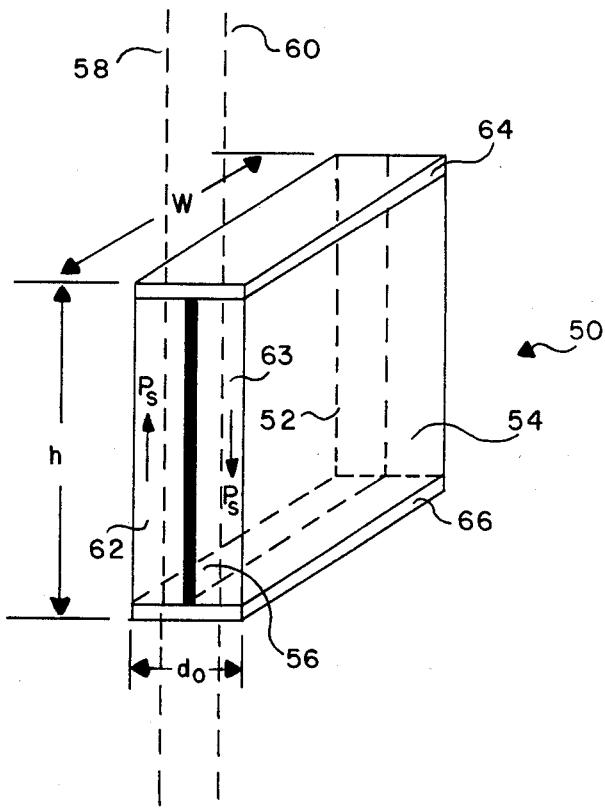
FIG. 4 is a schematic of two plates cemented together. Each plate is ferroelectric, has remanent polarization, and exhibits a length-dependent photoelectric effect. Electrodes are attached to the top and bottom tips of the plate.

FIG. 4 shows a third embodiment of the present invention. This device is a flexible piezoelectric bimorph. It is constructed by cementing two prepolarized plates of photovoltaic ferroelectric ceramic material together with their remanent polarizations parallel and oppositely directed. Electrodes cover the tips of the plates to electrically connect them to each other. Illumination falling on one of the faces of the bimorph is absorbed within that plate or is backscattered out with no illumination penetrating into the second sheet. The absorbed illumination generates a current within the plate. The current flow charges the common pair of electrodes and generates a longitudinal electric field along the length of the plates. The current flow is opposite in direction to the polarization. Because of this the longitudinal field is directed so as to cause the length of the illuminated plate to increase, and the length of the dark, oppositely polarized plate to decrease. These deformations are the result of the inverse piezoelectric effect. To accommodate these changes in length, the bimorph bends to form an arc, with the tips moving away from the source of the illumination.

As shown in FIG. 4, the bimorph 50 consists of a first plate 52 cemented to a second plate 54 by a layer of cement 56. The material of first plate 52 is ferroelectric, has remanent polarization, and exhibits a length-dependent photoelectric effect. Plate 52 has an axis 58 and is a rectangular polyhedron. Plate 52 has an edge 62. Second plate 54 consists of material which is ferroelectric, has remanent polarization, and which exhibits a length-dependent photoelectric effect. Plate 54 has an axis 60, which is parallel to axis 58, and is a rectangular polyhedron. Plate 54 has an edge 63. The cement used in the bimorph may be contact cement or any other suitable type of cement. The bimorph has a top common electrode 64 to electrically connect the top tips of plates 52 and 54 to each other, and bottom common electrode 66 to electrically connect the bottom tips of plates 52 and 54 to each other. The direction of the remanent polarization of plate 52 is from the bottom tip to the top tip, and the direction of the remanent polarization of plate 54 is from the top tip to the bottom tip. The bimorph has a total height equal to h, a total width equal to w, and a total thickness equal to $d_o$.

Figure 5:
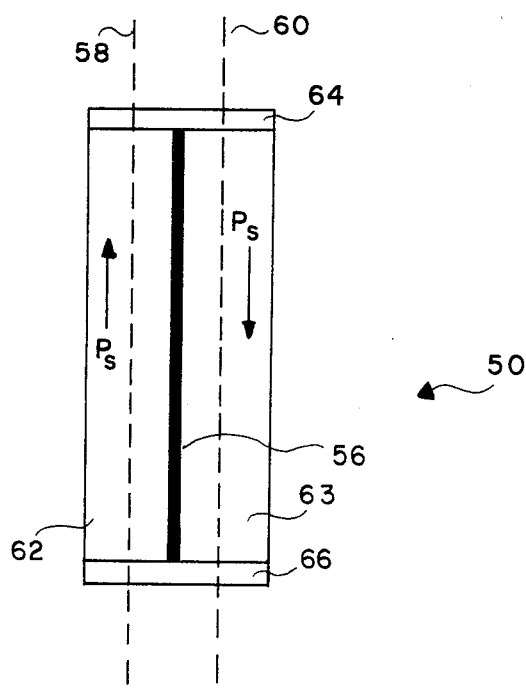
FIG. 5 is an edge view of the pair of cemented plates of FIG. 4. Elements of FIG. 5 which correspond to those of FIG. 4 are correspondingly numbered.
Figure 6:
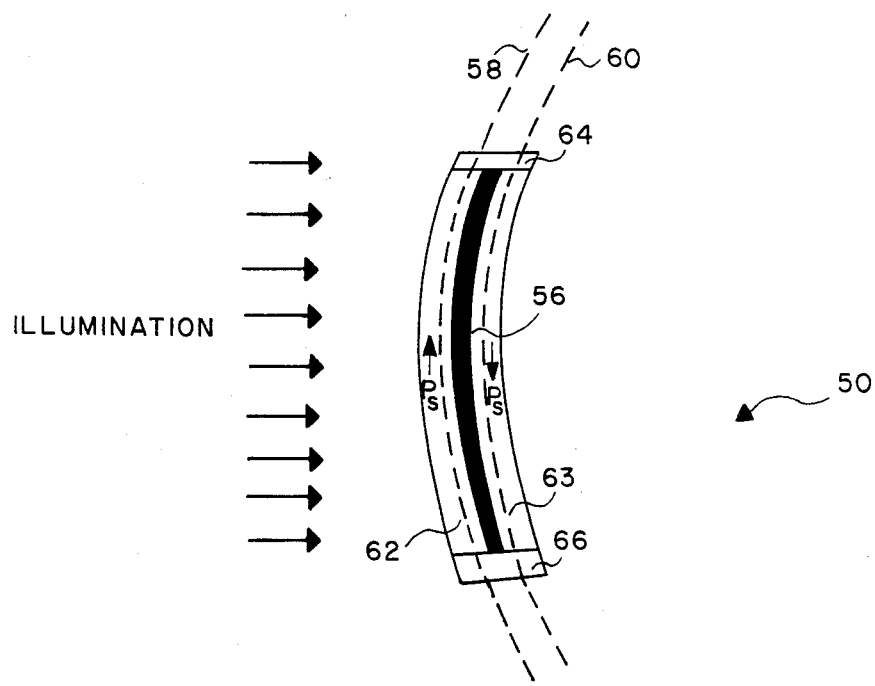
FIG. 6 shows the deformation caused by illuminating the plates of FIGS. 4 and 5. Elements of FIG. 6 which correspond to those of FIGS. 4 and 5 are correspondingly numbered.

FIG. 5 shows an edge of bimorph 50 of FIG. 4. FIG. 6 shows the deformation that occurs when one face of bimorph 50 is illuminated. The illumination causes the length of the illuminated sheet to increase, and the length of the dark, oppositely polarized sheet to decrease. To accommodate these changes in length, the bimorph bends to form an arc as shown. The tips of the bimorph bend away from the source of the light.

Figure 7:
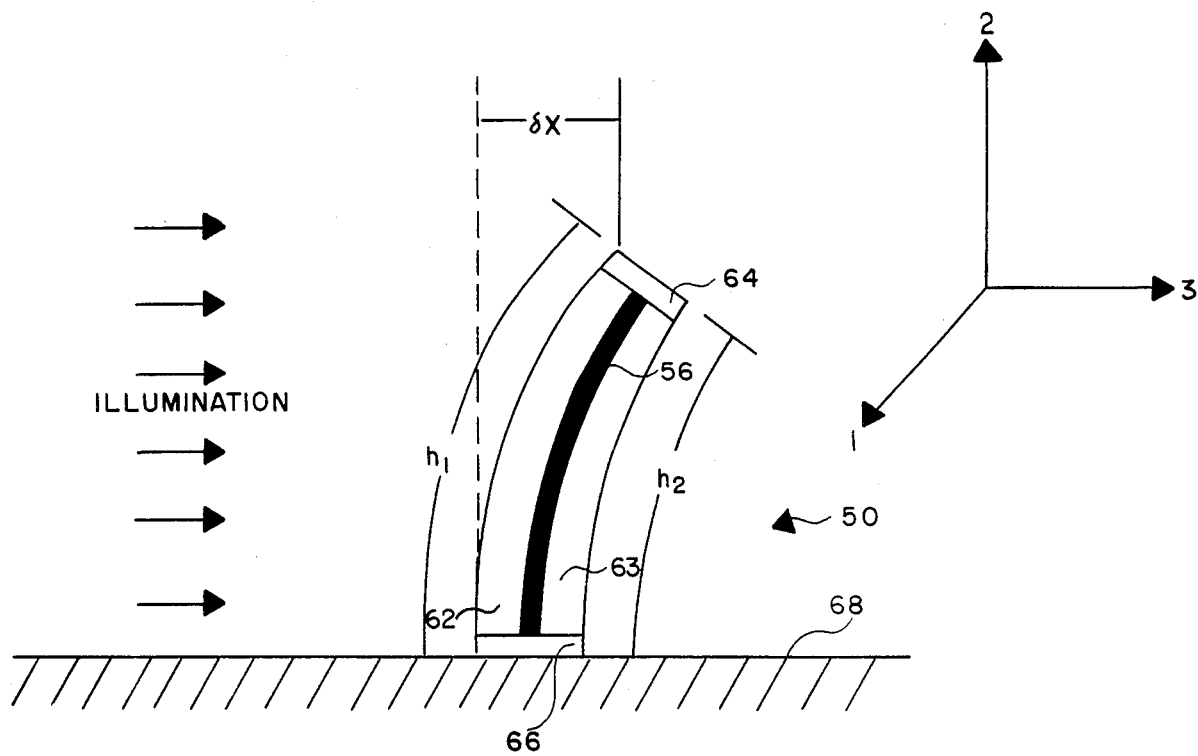
FIG. 7 is a schematic showing the magnitude of the deformation caused by illuminating the pair of cemented plates previously shown in FIGS. 4, 5, and 6. Elements of FIG. 7 which correspond to those of FIGS. 4, 5, and 6 are correspondingly numbered.

FIG. 7 shows bimorph 50 mounted on base 68. To calculate the deflection in terms of the strains in the individual plates, note that as the bimorph deflects, the height h increases to $h+\delta h=h_1$, for the illuminated plate, and shrinks to $h-\delta h=h_2$ for the other plate. Where d is the total bimorph thickness (two plates of equal thickness d/2), the bimorph's tip-end as deflection, δx, is $$\delta x = \frac{h_1(h_1 - h_2)}{2d_o} = \frac{h^2}{2d}\left(\frac{2\delta h}{h}\right) \quad (6)$$

from elementary geometrical considerations, assuming long thin plates and small quasistatic strains. From the equations relating electric field and induced strain, the tip-end deflection due to the photovoltaic charging of the electrodes is $$\delta x = \frac{h^2 d_{33} e(t)}{d} \quad (7)$$

where e(t) is the longitudinal electric field generated by the charge on the electrodes and d$_{33}$ is the piezoelectric constant relating the longitudinal strain and the longitudinal electric field. The initial rise of the photovoltaic field as the result of uniform illumination, I(t), incident onto a bimorph of width w is $$e(t) = \frac{wi_o}{hC_o} \int I(t)\,dt \quad (8)$$

where $C_o$ is the capacitance between the electrodes and $i_o$ is the photovoltaically generated short-circuit current per unit width per unit intensity. Combining equations (2) and (3), we obtain the tip-end deflection:

$$\delta x(t) = \left(\frac{h}{d}\right)^2 \frac{d_{33} i_o}{\epsilon_o \epsilon_{33}} \int I(t)dt. \quad (9)$$

We have used the parallel-plate capacitor formula for $C_o$ (the long thin configuration notwithstanding), because of the high values for permittivity, $\epsilon_{33}$, in the ceramic PZT-5a. The initial velocity of the tip end (deflectional velocity) is then $$\frac{d}{dt}(\delta x) = \left(\frac{h}{d}\right)^2 \frac{d_{33} i_o I(t)}{\epsilon_o \epsilon_{33}}. \tag{10}$$

Thus, for small deflections, the deflectional velocity is proportional to the illumination intensity. The initial tip-end deflection itself (eq (9)) is proportional to the time integral of the illumination intensity—that is, to the total incident energy.

At illumination levels which produce voltage saturation, an equivalent circuit can be assumed in which the capacitance between the electrodes is charged to the saturation open-circuit voltage, as if that saturation voltage were a photo-electromotive force driving an ohmic current through the photoresistance of the illuminated bimorph element. The longitudinal electric field thus rises with time, following an RC charging curve. If we assume a uniform constant illumination intensity $I_o$ turned on at $t=0$ and use the equivalent circuit, we obtain for the tip-end deflection $$x(t) = \frac{h^2}{d} d_{33} e_o \left[1 - \exp\frac{(-t)}{(R_f C_o)}\right], \tag{11}$$

where $$R_f = \frac{e_o h}{i_i I_o W} \tag{12}$$

and $e_o$ is the saturation photovoltaic field. The expression for x can also be written $$\delta x(t) = \frac{h^2}{d} d_{33} e_o \left[1 - \exp\left(\frac{-i_o I_o t}{\epsilon_{33} \epsilon_o e_o d}\right)\right], \tag{13}$$

where we have substituted both for $R_f$ and $C_o$.

Figure 8:
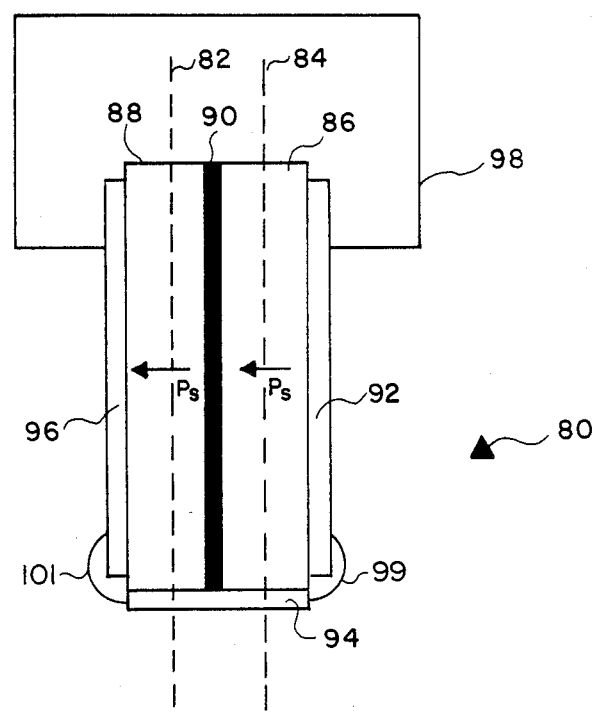
FIG. 8 shows the arrangement of plates and electrodes required to cause the pair of cemented plates to bend toward a source of illumination.

FIG. 8 shows a bimorph-electrode arrangement used to cause the bimorph 80 to bend toward the source of the illumination. This figure is an edge view of a bimorph having first and second plates 88 and 86, respectively. The direction of the remanent polarization of the plates represented by arrows $P_s$, is the same and normal to axes 82 and 84 of plates 88 and 86. A first transparent electrode 96 is attached to a face of bimorph 80. A second electrode 92 is attached to the other face of bimorph 80. The first electrode 96 is attached to the second electrode 92 by means of a wire 98. A third electrode 94 is attached to the bottom tips of the plates to electrically connect them together, and by wires 99 and 101 to connect electrode 94 to electrodes 92 and 96.

Figure 9:
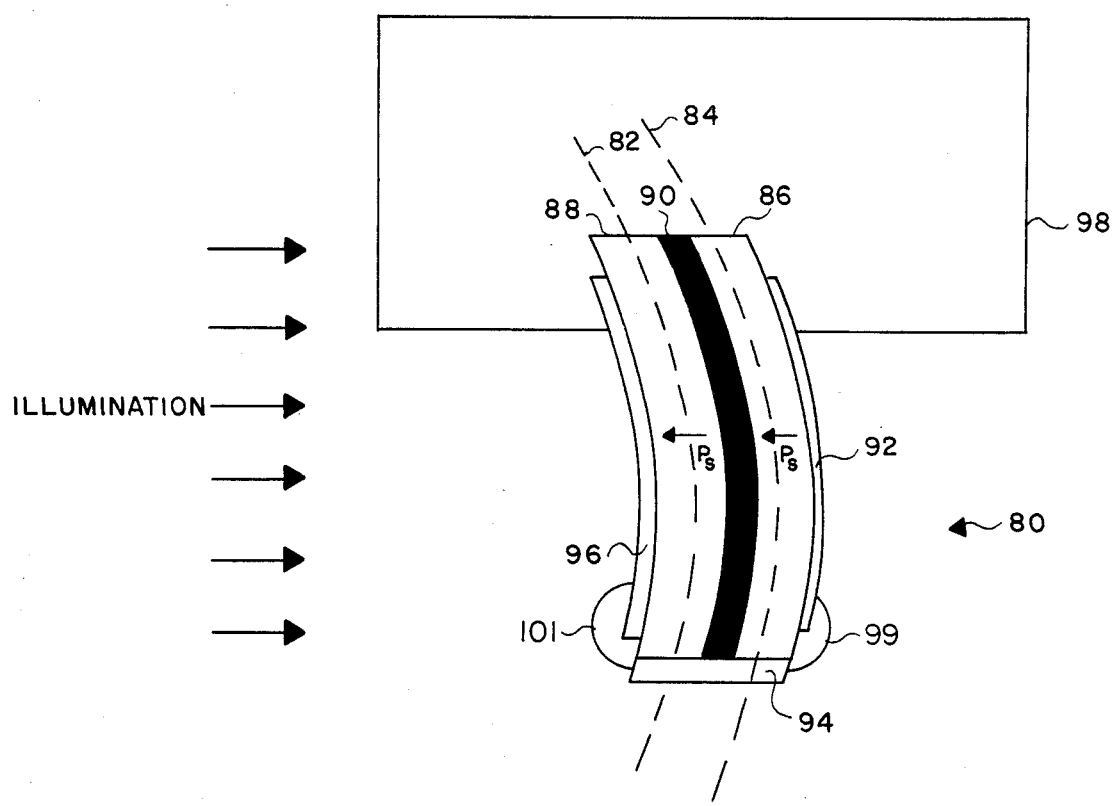
FIG. 9 is a schematic showing the deformation caused of illuminating the device of FIG. 8. Elements of FIG. 9 which correspond to those of FIG. 8 are correspondingly numbered.

FIG. 9 shows what occurs when bimorph 80 is illuminated by directing the light toward transparent electrode 96. The plates expand along axes 82 and 84 and the tips bend toward the source of the illumination.

Figure 10:
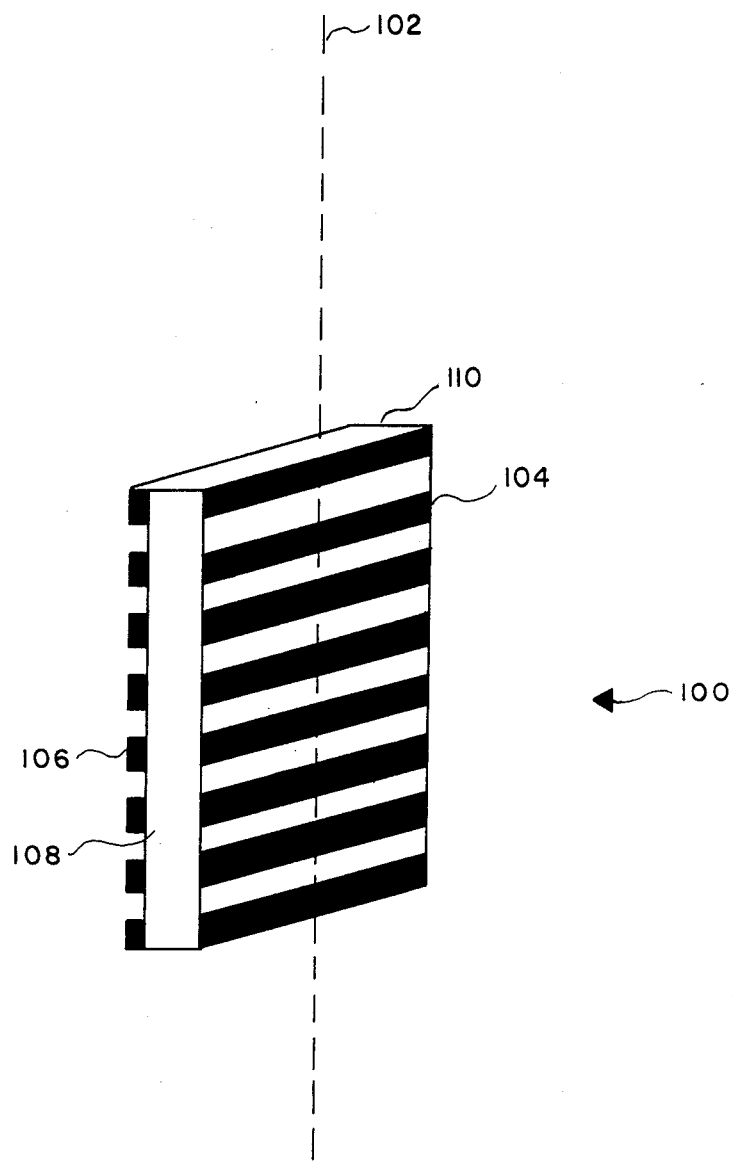
FIG. 10 is a schematic of a plate of material which is ferroelectric. Strip electrodes are disposed on both sides of the plate.

FIG. 10 shows a plate 100 of material which is ferroelectric and which exhibits a length-dependent photoelectric effect. Plate 100 has an axis 102, a first planar face 101, a second opposite planar face 102, a top tip 110, a bottom tip (not shown), and is in the shape of a rectangular polyhedron. A plurality of parallel strip electrodes 104 is attached to face 101 of plate 100. A plurality of parallel strip electrodes 106 is also attached to the second face 102 of plate 100. The electrodes are attached so as to be normal to axis 102, extend across the width of the plate, and are evenly separated from each other along the length of the plate.

Figure 11:
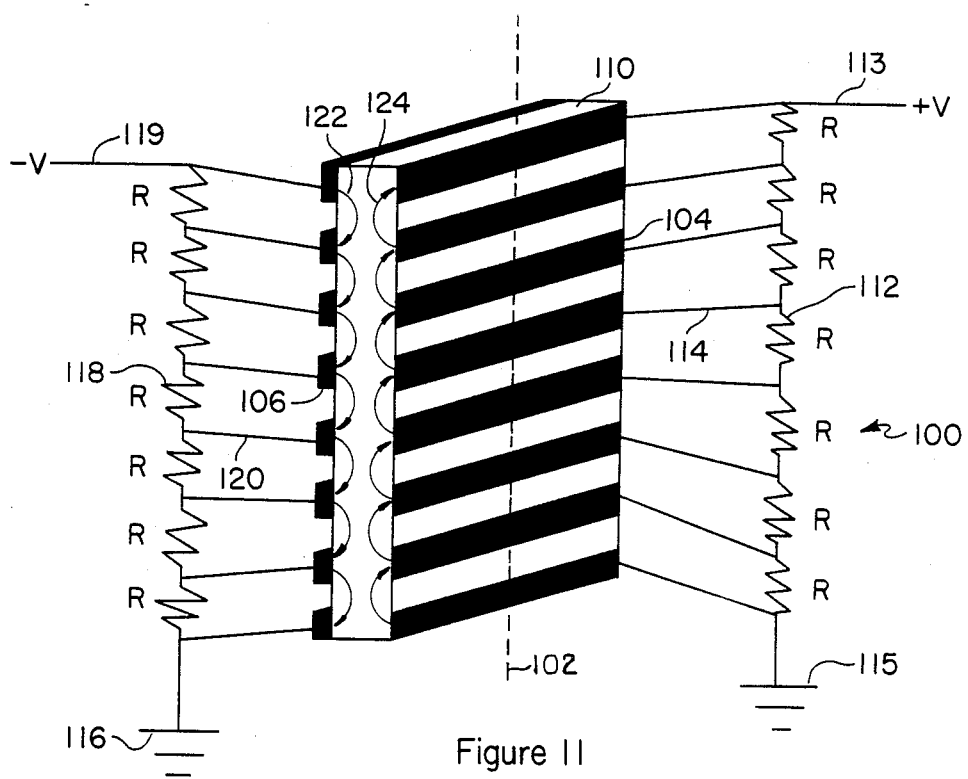
FIG. 11 shows the plate of FIG. 10 with the voltage divider network used to apply tangential poling fields to the plate. Elements of FIG. 11 which correspond to those of FIG. 10 are correspondingly numbered.

FIG. 11 shows two resistor networks used to produce tangential poling fields in plate 100. A positive potential $+V$ is applied through wire 113 to a string of resistors 112. Each resistor has the same value of resistance, R, and the resistor string 112 terminates at ground 115. The strip electrodes 104 on the first face of plate 100 are connected to the resistor string 112 by means of wires 114. The tangential poling field produced is shown by arrows 124, and is directed from the bottom tip to the top tip.

A negative potential $-V$ is applied through wire 119 to a string of resistors 118. Each resistor has the same value of resistance, R, and the resistor string 118 terminates at ground 116. The strip electrodes 106 on the second face of plate 100 are connected to the resistor string 118 by means of wires 120. The tangential poling field produced is shown by arrows 122, and is directed from the top tip to the bottom tip. The potentials in both cases should be such that the poling fields penetrate only approximately one half of the thickness of plate 100.

Figure 12:
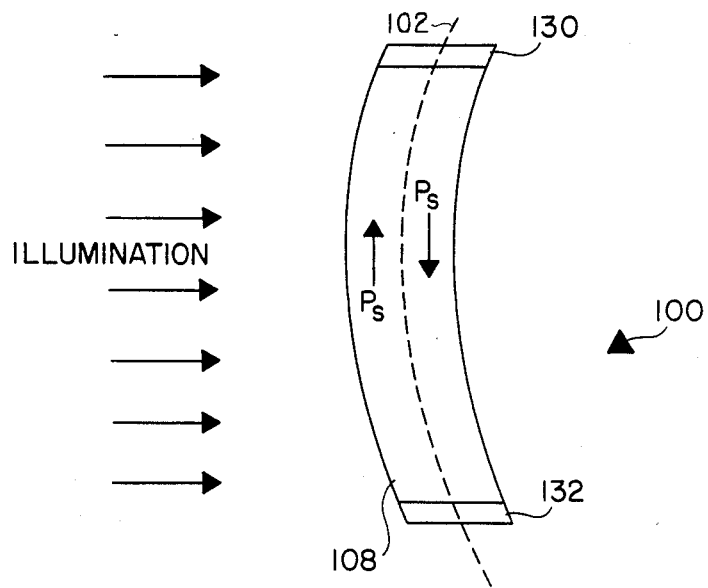
FIG. 12 shows the deformation caused by illuminating the plate of FIG. 11 with the strip electrodes removed and electrodes added to the top and bottom tips. Elements of FIG. 12 which correspond to those of FIG. 11 are correspondingly numbered.

Once the poling fields are produced in plate 100, the potentials are removed along with both resistor strings. The strip electrodes are also removed form both faces of plate 100 so that more light may impinge upon it. FIG. 12 shows plate 100 with all of the strip electrodes removed but with electrode 130 attached to its top tip, and electrode 132 attached to its bottom tip. The purpose of electrodes 130 and 132 is to facilitate electrical conduction between the two halfs of plate 100. FIG. 12 also shows the tip end deflection produced by illumination.

Figure 13:
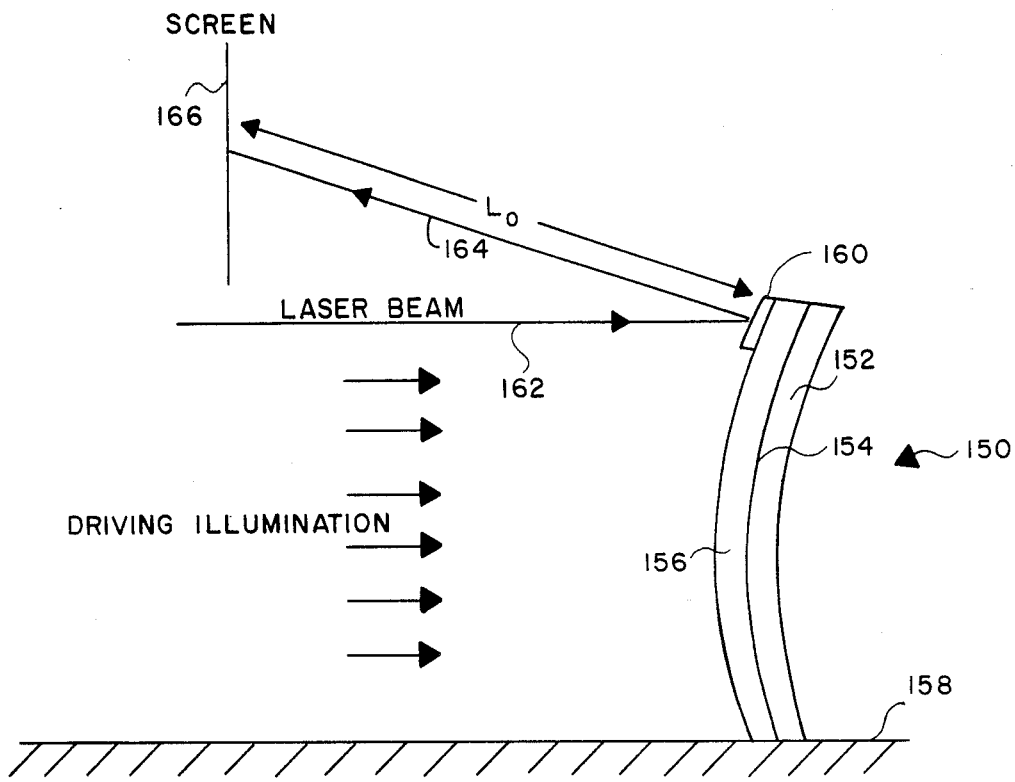
FIG. 13 is a schematic of the arrangement used to measure tip deflection.

FIG. 13 shows the experimental arrangement used to measure tip-end deflection as a function of time for a bimorph 150. Bimorph 140 consists of a first plate 152, a layer of cement 154, and a second plate 156. One tip of bimorph 150 is mounted to base 158. A mirror 160 is attached to the top part of plate 156. A laser beam 162 is directed at mirror 160 and reflected to screen 166. The screen 166 is $L_o$ meters away from mirror 166. When the bimorph is illuminated it bends away from the source of the illumination. This in turn causes movement of the spot of laser light on screen 166. The tip-end deflection $\Delta x$ in terms of the laser spot deflection $\delta x$ is $$\delta_x = \frac{h \Delta x}{4 L_o}, \tag{14}$$

where h is the undeflected height of the bimorph.

Two sets of measurements were taken. In one, the bimorph was illuminated uniformly with light from a mercury arc, which was wavelength filtered to produce illumination centered at 370 nm. In the other, an argon ion laser produced 351- and 363-nm mixed radiation; this radiation was optically formed into a vertical sheet that illuminated a lateral surface of the bimorphs so that the electrode appeared connected by a strip of light narrower than the bimorph. For uniform illumination, the photovoltage rises and the bimorph deflects as indicated by equation (13), and the initial deflectional velocity is given by expression (10). For the second case the intensity $I_o$ of the sheet beam must be replaced by an average intensity that is equal to the ratio of beam width to element width multiplied by $I_o$. This means that the initial deflectional velocity would be increased, were the width of the experimental bimorph reduced to the width of beam. In our experiment this would have meant a sixfold increase in velocity and the same decrease in time constant. This decrease in time constant may be simply understood as the result of a decrease in "parasitic" capacitance.

Figure 14:
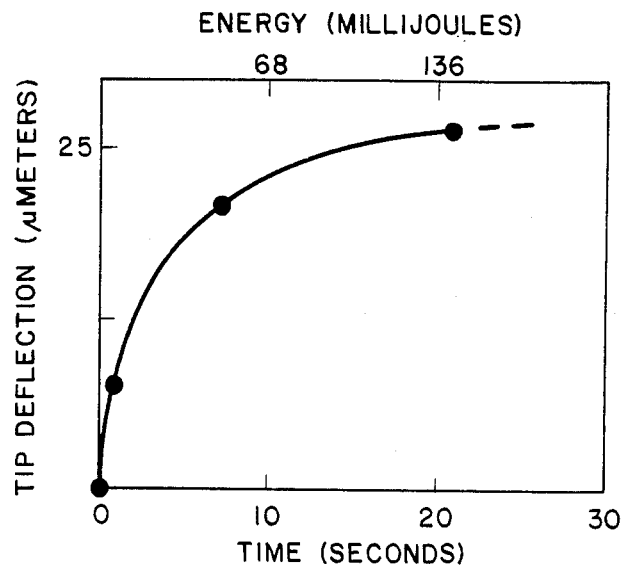
FIG. 14 shows the responses of a pair of cemented plates to 6.0 mW/CM$^2$ illumination at 370 nm from a mercury arc lamp. Measurements made at discrete intervals are shown by marked points.
Figure 15:
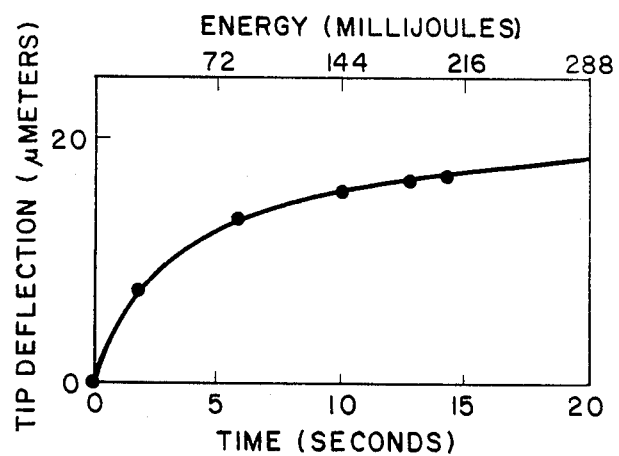
FIG. 15: The curve shows the response to sheet beam illumination of a one-sixth bimorph width and incident power of 14 mW.

Experimental results are shown in FIGS. 14 and 15. Since the illumination is a step increase to a constant power, time and total incident energy are proportional.

The bimorph dimensions were h=2 cm, d=0.033 cm, and w=0.57 cm. The measured saturation photovoltaic filed for the ceramic was 348 V/cm, and the $d_{33}$ constant for the ceramic was $374\times 10^{-12}$ C/N. From these values, the saturation deflection calculated using equation (7) is 22 um. This value is in approximate agreement with the measured values in FIGS. 14 and 15.

We can use equation (10) to calculate the initial deflectional velocity. We do this first for the test with uniform broad-band illumination (FIG. 14). The current constant, $i_o$, for broad-band illumination with wavelengths centered at 370 nm was measured to be $0.1\times 10^{-6}$ A cm/W; $_{33}$ for PZT-5a is 1700. The experimental intensity was $6\times 10^{-3}$ W/cm$^2$. The deflectional velocity calculated from these values is 5 um/s. The experimental velocity obtained from the initial slope of the curve in FIG. 14 is 7 um/s. The calculated and experimental reslusts are in approximate agreement.

The second comparison is for the test using laser illumination (FIG. 15). The current constant, $i_o$, for the laser radiation was measured to be $0.075\times 10^{-6}$ A cm/W. Using the value of $\epsilon_{33}$, the input intensity, the dimensions of the bimorph, and the sheet beam width of 0.1 cm, we obtain a calculated deflectional velocity for this test of 4 um/s. The experimental value obtained from the slope in FIG. 15 is 5 um/s. Again, the calculated and directly meansured values for the initial deflectional velocity are in essential agreement.

In each embodiment of the present invention the ferroelectric materials can comprise photovoltaic, piezoelectric ceramics. One such ceramic is a solid solution of lead titanate and lead zirconate having the compositional formula $Pb(Zr_{0.53}Ti_{0.47})O_3$ to which is added 1% by weight of niobium oxide. Another such ceramic is a solid solution of lead titanate with 5% by weight of magnesium oxide and 5% by weight of tungsten oxide having the compositional formula $0.9PbTiO_3\text{-}0.1Pb(Mg_{\frac{1}{2}}W_{\frac{1}{2}})O_3$.

While the invention has been described to make reference to the accompanying drawings, I do not wish to be limited to the details shown therein as obvious modifications may be made by one of ordinary skill in the art.

I claim:

1. A method for deforming materials which are ferroelectric, have remanent polarization, and which exhibit a length-dependent photoelectric effect, comprising the step of illuminating a plate of said material to cause the deformation of said plate.

2. The method of claim 1 wherein said plate has an axis and first and second opposite planar faces extending between opposite top and bottom tips to form a rectangular polyhedron.

3. The method of claim 2 wherein the direction of the remanent polarization of said plate is from said bottom tip to said top tip, such that said plate expands along said axis and said tips bend away from the source of illumination.

4. The method of claim 2 wherein the direction of the direction of the remanent polarization of said plate is normal to said axis, such that said plate expands normal to said axis.

5. The method of claim 4 wherein the wavelength of the illumination is such that it will be transmitted through the thickness of said plate.

6. The method of claim 1 wherein said materials comprise photovoltaic, piezoelectric, ferroelectric ceramics.

7. The method of claim 6 wherein said ceramic is a solid solution of lead titanate and lead zirconate having the compositional formula $Pb(Zr_{0.53}Ti_{0.47})O_3$ to which is added 1% by weight of niobium oxide, or said ceramic is a solid solution of lead titanate with 5% by weight of magnesium oxide and 5% by weight of tungsten oxide having the compositional formula $0.9PbTiO_3\text{-}0.1Pb(Mg_{\frac{1}{2}}W_{\frac{1}{2}})O_3$.

8. A method for deforming materials which are ferroelectric, have remanent polarization, and which exhibit a length-dependent photoelectric effect, comprising the steps of:
   a. bonding a first plate of said material to a second plate of said material; and
   b. illuminating at least one of said plates to cause the deformation of the plates.

9. The method of claim 8 wherein said plates each have an axis and first and second opposite planar faces extending between the opposite top and bottom tips forming rectangular polyhedrons.

10. The method of claim 9 wherein the direction of the remanent polarization of said first plate is from said bottom tip to said top tip, and the direction of the remanent polarization of said second plate is from said top tip to said bottom tip, such that the illuminated plate expands along the axis and the length of the other plate decreases along the axis, and the tips bend away from the source of the illumination.

11. The method of claim 10 further comprising the steps of:
   a. attaching first electrode means to the top tips of said plates for electrically connecting the top tips to each other; and
   b. attaching second electrode means to the bottom tips of said plates for electrically connecting the bottom tips to each other.

12. The method of claim 9 wherein the direction of the remanent polarization of said plates is the same and normal to said axis of each plate.

13. The method of claim 12 further comprising the steps of:
   a. attaching a first transparent electrode to one face of the pair of bonded plates;
   b. attaching a second electrode to the other face of the pair of bonded plates;
   c. electrically connecting said transparent electrode to said second electrode;
   d. attaching third electrode means to the bottom tips of said plates for electrically connecting the bottom tips to each other; and
   e. illuminating said transparent electrode so as to cause the illuminated plate to decrease in length along its axis, the other plate increases in length along its axis, and said tips to bend toward the source of illumination.

14. The method of claim 8 wherein said materials comprise photovoltaic, piezoelectric, ferroelectric ceramics.

15. The method of claim 14 wherein said ceramic is a solid solution of lead titanate and lead zirconate having the compositional formula $Pb(Zr_{0.53}Ti_{0.47})O_3$ to which is added 1% by weight of niobium oxide, or said ceramic is a solid solution of lead titanate with 5% by weight of magnesium oxide and 5% of weight of tungsten oxide having the compositional formula $0.9PbTiO_3\text{-}0.1Pb(Mg_{\frac{1}{2}}W_{\frac{1}{2}})O_3$.

16. A method comprising the steps of:
   a. attaching a plurality of parallel strip electrodes to the first planar face of a plate of ferroelectric material which exhibits a length-dependent photoelectric effect;
   b. attaching a plurality of parallel strip electrodes to the second planar face of said plate, said second face being parallel to said first face;
   c. said plate has opposite top and bottom tips a specified distance apart which define an axis and between which extend said first and second planar faces to form a rectangular polyhedron;
   d. said electrodes are normal to said axis, extend across the width of the plate, and are evenly separated from each other along the length of the plate;
   e. applying a positive tangential poling field to the electrodes of the first face of the plate such that the poling field penetrates approximately one half of the thickness of the plate and causing a remanent polarization in said plate along said axis from said bottom tip to said top tip;
   f. applying a negative tangential poling field to the electrodes of the second face of the plate such that the poling field penetrates approximately one half of the thickness of the plate and causing a remanent polarization in said plate along said axis from said top tip to said bottom tip;
   g. removing both the positive tangential poling field and the negative tangential poling field, and
   h. illuminating said plate such that it expands along said axis and said tips bend away from the source of light.

17. The method of claim 16 further comprising the steps of:
   a. removing the strip electrodes from the first and second faces of said plate;
   b. attaching a first electrode to the top tip of said plate; and
   c. attaching a second electrode to the bottom tip of said plate.

18. The method of claim 16 wherein the wavelength of the illumination is such that it will not be transmitted through more than approximately one half of the thickness of said plate.

19. The method of claim 16 wherein said ferroelectric materials comprise photovoltaic, piezoelectric ceramics.

20. The method of claim 19 wherein said ceramic is a solid solution of lead titanate and lead zirconate having the compositional formula $Pb(Zr_{0.53}Ti_{0.47})O_3$ to which is added 1% by weight of niobium oxide, or said ceramic is a solid solution of lead titanate with 5% by weight of magnesium oxide and 5% by weight of tungsten oxide having the compositional formula $0.9PbTiO_3\text{-}0.1Pb(Mg_{\frac{1}{2}}W_{\frac{1}{2}})O_3$.

* * * * *